(12) United States Patent
Tay et al.

(10) Patent No.: US 8,412,006 B2
(45) Date of Patent: Apr. 2, 2013

(54) OPTOCOUPLER

(75) Inventors: Thiam Siew Gary Tay, Singapore (SG); Gopinath Maasi, Singapore (SG)

(73) Assignee: Avago Technologies ECBU IP (Singapore) Pte. Ltd., Singapore (SG)

(*) Notice: Subject to any disclaimer, the term of this patent is extended or adjusted under 35 U.S.C. 154(b) by 330 days.

(21) Appl. No.: 12/729,943

(22) Filed: Mar. 23, 2010

(65) Prior Publication Data

US 2011/0235974 A1      Sep. 29, 2011

(51) Int. Cl.
*G02B 6/12*      (2006.01)
*G02B 6/36*      (2006.01)

(52) U.S. Cl. .......... 385/14; 385/39; 385/88; 385/92

(58) Field of Classification Search .......... 385/14, 385/39, 88–94
See application file for complete search history.

(56) References Cited

U.S. PATENT DOCUMENTS

| | | | |
|---|---|---|---|
| 4,114,177 A | 9/1978 | King | |
| 4,179,619 A | 12/1979 | Cook | |
| 4,450,461 A * | 5/1984 | Cook et al. | 257/82 |
| 5,150,438 A | 9/1992 | Brown | |
| 5,329,131 A | 7/1994 | Wijdenes et al. | |
| 5,340,993 A | 8/1994 | Salina | |
| 5,500,912 A | 3/1996 | Alonas et al. | |
| 5,614,131 A | 3/1997 | Mukerji et al. | |
| 5,751,009 A | 5/1998 | Anderson et al. | |
| 5,753,929 A | 5/1998 | Bliss | |
| 6,246,123 B1 | 6/2001 | Landers et al. | |
| 6,556,750 B2 * | 4/2003 | Constantino et al. | 385/41 |
| 6,756,689 B2 * | 6/2004 | Nam et al. | 257/783 |
| 6,864,509 B2 | 3/2005 | Worley | |
| 6,943,378 B2 * | 9/2005 | Kek et al. | 257/82 |
| 7,021,839 B2 | 4/2006 | Ho | |
| 7,112,457 B2 * | 9/2006 | Kek et al. | 438/25 |
| 7,476,890 B2 | 1/2009 | Kishi | |
| 7,589,338 B2 | 9/2009 | Liu et al. | |
| 7,748,912 B2 | 7/2010 | Ho et al. | |
| 7,868,465 B2 * | 1/2011 | Otremba et al. | 257/783 |
| 7,956,338 B2 | 6/2011 | Keita et al. | |
| 8,106,406 B2 * | 1/2012 | Liu et al. | 257/81 |
| 2007/0045882 A1 | 3/2007 | Ho et al. | |
| 2009/0174048 A1 | 7/2009 | Liu et al. | |
| 2011/0235974 A1 | 9/2011 | Tay et al. | |

FOREIGN PATENT DOCUMENTS

EP      0103032      3/1984

OTHER PUBLICATIONS

Kek, Theng-Hui et al., "Stacked LED Makes Compact Optocouplers", *Semiconductor Products Group Isolation Products Division Agilent Technologies Inc.* Apr. 1, 2005.

* cited by examiner

*Primary Examiner* — Daniel Petkovsek

(57) ABSTRACT

An optocoupler with optical transmitter and receiver dies attached to a single conductive pad is presented. One of the optical transmitter and receiver dies may be attached directly to the conductive pad, while the other one of the optical transmitter and receiver dies may be attached to the conductive pad by means of three layers of materials comprising an isolation layer sandwiched between two attachment layers. A multi-channel optocoupler with multiple transmitter and/or receiver dies is also presented, in which one of the optical transmitter and receiver dies may be attached directly to the conductive pad. The other optical transmitter or receiver dies may be attached to the conductive pad by means of three layers of materials comprising an isolation layer sandwiched between two attachment layers.

20 Claims, 6 Drawing Sheets

OPTOCOUPLER

BACKGROUND

Galvanic isolator provides a mean for moving a signal from one electrical circuit to another electrical circuit that must otherwise be electrically isolated from one another. Usually the two electrical circuits operate at different voltages and need to be electrically isolated. For example, consider an application in which a 5V battery powered controller board is used to control a motor circuit operating at 240V. In this example, it is essential to electrically isolate the 240V motor circuits from the 5V controller circuit while allowing the 5V controller circuit to send or receive signals from the 240V motor circuit. In this type of application, a galvanic isolator may be used to provide voltage and noise isolation while allowing the information exchange between the two circuit systems. For electrical system involving more than two circuits operating at different voltages, a multi-channel galvanic isolator may be used.

There are three main types of galvanic isolators. The first type is wireless radio frequency transceiver in which a signal is sent across from one circuit to another circuit through wireless signal. The second type is magnetic isolator in which the signal is transmitted over through magnetic field. The third type is optocoupler in which the signal is transfer through light waves. As galvanic isolators may be used in application involving voltage operating at kilo Volts, magnetic isolators and radio frequency isolators may have limitation in shielding noise from one circuit system to another circuit system. On the other hand, optocouplers, coupling signal through light waves, do not induce noise as per magnetic isolators or radio-frequency transceivers.

Generally, an optocoupler comprises an optical transmitter die and an optical receiver die. The optical transmitter die and the optical receiver die may be housed in one package. A multi-channel optocoupler may have more than one pair of optical transmitter or receiver dies, for example a plurality of optical transmitter and receiver dies.

BRIEF DESCRIPTION OF THE DRAWINGS

Illustrative embodiments by way of example, not by way of limitation, are illustrated in the drawings, in which.

DETAILED DESCRIPTION

Figure 1:
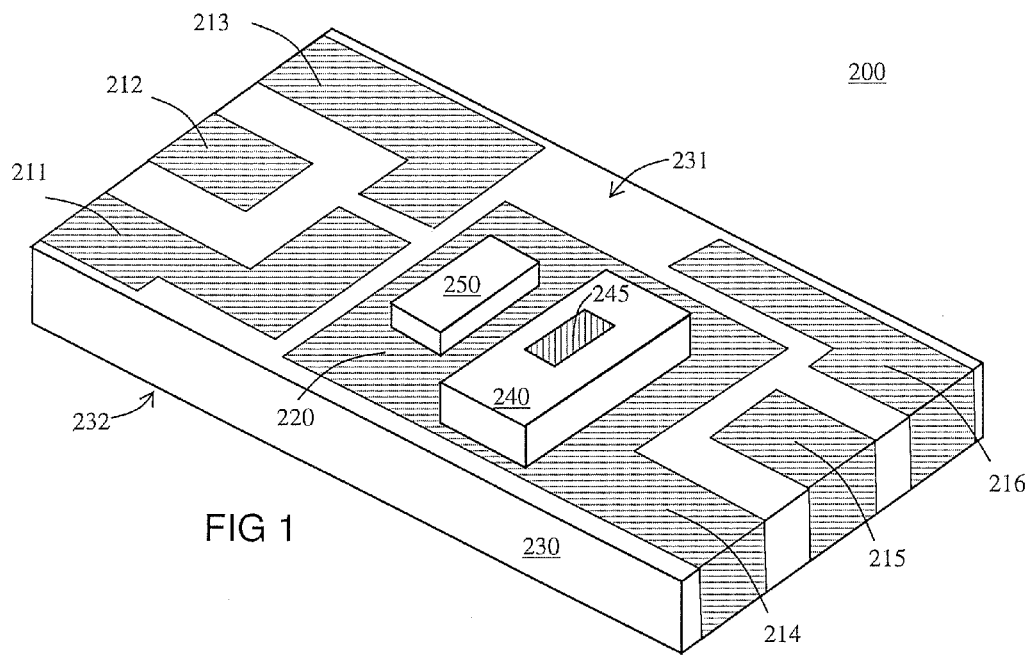
FIG. 1 illustrates an embodiment of a partially completed optocoupler, without wire bonds and without an encapsulant.

With reference to FIG. 1, an embodiment of a partially completed optocoupler 200, without wire bonds and without an encapsulant, includes a substrate 230, an optical transmitter die 250 and an optical receiver die 240. The substrate 230 may be a printed circuit board (referred to hereinafter as PCB), a molded plastic platform adaptable to hold lead frames, or other similar means. The substrate 230 has a top surface 231 and a bottom surface 232.

A plurality of conductors 211-216 are located on the top surface 231. One of the plurality of conductors 214 may be extended to form a conductive pad 220. The conductive pad 220 may be configured to hold dies such as the optical transmitter die 250 and the optical receiver die 240. The plurality of conductors 211-216 may be in a form of conductive traces, to be configured as a mean to connect the dies 240 and 250 to external circuitry (not shown). For example, the plurality of conductors 211-216 may be extended to the edge or the bottom surface 232 of the substrate 230 to serve as electrical contacts to external circuitry (not shown). The plurality of conductors 211-216 and the conductive pad 220 may be implemented as a lead frame or metal traces on a PCB.

The optical transmitter die 250 may be a light emitting diode (hereinafter LED) or any light source capable of emitting light. The optical transmitter die 250 may be an integrated circuit (IC) die with an embedded LED and driver circuit. Depending on the design requirements, control circuitry may be integrated into the optical transmitter die 250. The optical transmitter die 250 may be configured to be powered by a first power supply (not shown) by means of conductors 211 and 213 located on the substrate 230. The optical transmitter die 250 may be operable to emit light in accordance with a logic signal from an external circuit (not shown) operating on the first power supply. For example, a logic signal "HIGH" may be transmitted to the optical transmitter die 250 through conductor 213. The optical transmitter die 250 would in response, emit light output indicating the "HIGH" signal.

The optical receiver die 240 may comprise a photo detector 245, such as a photo diode or a photo transistor. The optical receiver die 240 may alternatively be an integrated circuit die with an embedded photo detector 245 and optionally amplifier circuitry to amplify photocurrent generated by the photo detector 245. The optical receiver die 240 may alternatively be a photo diode with external amplifying circuitry (not shown). Depending on the design requirements, control circuitry may be integrated into the optical receiver die 240 to provide signal processing. The optical receiver die 240 may be configured to be powered by a second power supply (not shown) through conductors 214 and 216. The optical receiver die 240 may be operable to receive a signal in the form of light emitted from the optical transmitter die 250. Subsequently, the optical receiver die 240 may provide an output of the received signal to an external circuit (not shown).

The optical receiver die 240 and the optical transmitter die 250 may be attached to the conductive pad 220 on the top surface 231 of the substrate 230. The optical transmitter die 250 may be configured to emit light which may be received by the optical receiver die 240. Attaching both dies to common conductive pad 220 may yield a smaller packaging size for the optocoupler 200, and thus, an overall smaller optocoupler profile. In addition, by attaching the two dies on the same conductive pad 220, the distance between the two dies becomes smaller. This may reduce energy lost as light travels less distance until being received at the optical receiver die 240.

Figure 2:
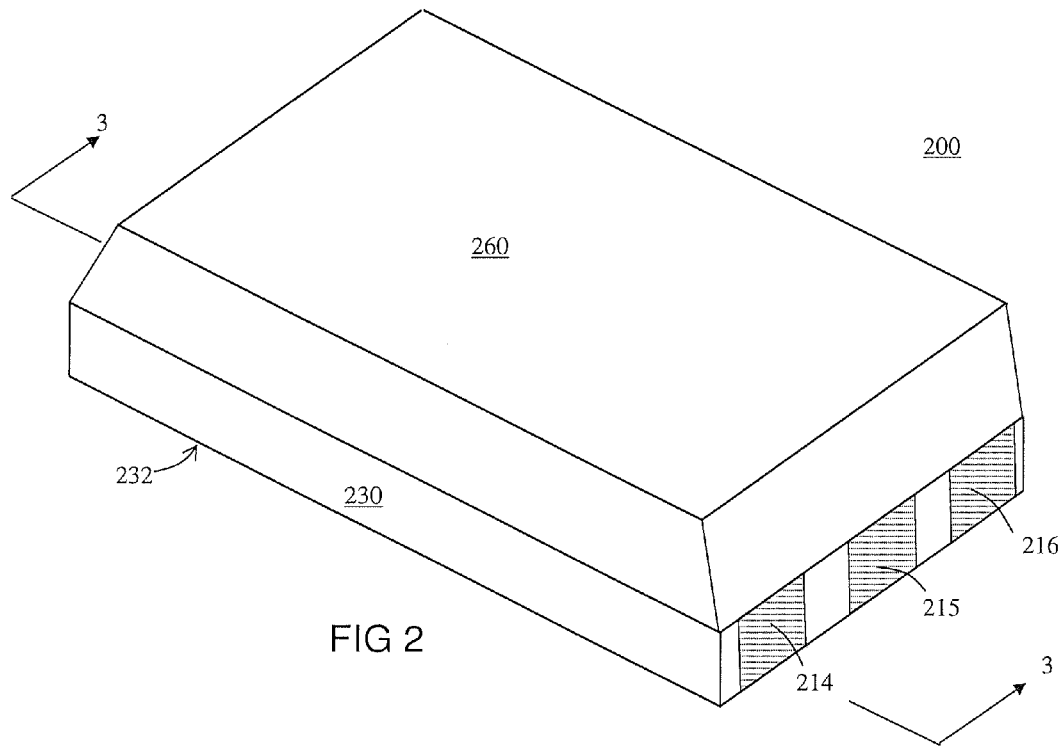
FIG. 2 illustrates an embodiment of the optocoupler in FIG. 1 shown complete with an encapsulant.

FIG. 2 illustrates an embodiment of the optocoupler 200 after going through wire bond and encapsulation to define a complete optocoupler. Portions of the conductors 214-216 located on the edges of the substrate 230 may be left exposed to serve as external contacts to external circuits. The conductors 214-216 may be extended to the bottom surface 232 of the substrate 230. The encapsulant 260 may be a clear epoxy or other known encapsulant material. The encapsulant 260 may be coated with a layer of reflective material at the surface of the encapsulant 260 to reduce light loss due to reflection. The encapsulant 260 may be left uncoated.

Figure 3:
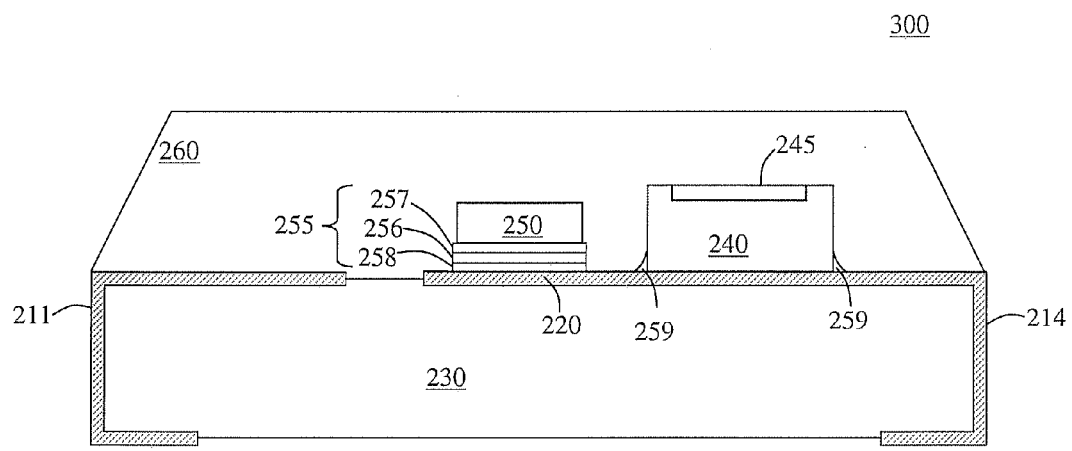
FIG. 3 illustrates a cross sectional view of the optocoupler along section line 3-3 of FIG. 2.

FIG. 3 illustrates a cross sectional view of the optocoupler 200 along section line 3-3 of FIG. 2. As shown in FIG. 3, the conductors 211 and 214 may be extended to the edge and bottom of the substrate 230. The conductor 214 may be further extended to form the conductive pad 220. The optical receiver die 240 may be attached to the conductive pad 220 directly, such that the photo detector 245 is facing in an upward position, operable to receive light. The optical receiver die 240 may also be secured on the conductive pad 220 through an insulating material 259 such as an epoxy material suitable for die-attachment use. The optical receiver die 240 may be electrically connected to the conductive pad 220. For example, a ground node of the optical receiver die 240 may be connected to the conductive pad 220 through a wire bond. In some cases, the connection may be established through the electrical connection between the body of the die which is usually biased to ground node and the conductive pad 220 through physical contact.

The optical transmitter die 250 may be attached to the conductive pad 220 through three layers of materials 255 comprising an isolation layer 256 sandwiched between two securing layers 257 and 258. The isolation layer 256 may prevent the optical transmitter die 250 from having contact with the conductive pad 220. The isolation layer 256 may be a layer of glass, a polyimide, or similar materials. The isolation layer 256 may or may not have sufficient adhesive properties to hold the optical transmitter die 250 onto the conductive pad 220.

The securing layer 257 may be a layer of silicon dioxide, silicon, nitride, benzo cyclo butane (BCB) or any other suitable insulating adhesive material. The securing layer 258 may be an epoxy material suitable for die attachment use. Such epoxy includes, but is not limited to, those epoxies sold by Tra-con of Massachusetts, USA. Both securing layers 257 and 258 have sufficient adhesive properties to hold the optical transmitter die 250 and the isolation layer 256 onto the conductive pad 220. The three layers of materials 255 may be electrically insulating, thus capable of providing the optical transmitter die 250 voltage and noise isolation from the conductive pad 220.

The securing layers 257 and 258 may be in liquid form at the beginning of manufacturing process, but are hardened later in the of manufacturing process, for example through exposure to heat or UV light to form a solid layer. The isolation layer 256 may prevent the optical transmitter die 250 from physically touching the conductive pad 220 at the beginning of manufacturing process when the securing layers 257 and 258 may be in liquid form.

The three layers of securing materials 255 may be made as thin as possible. For example, the three layers of materials 255 may be less than 100 micron. It will be appreciated by those in the art that there are design tradeoffs between a minimum thickness to ensure sufficient electrical isolation, and making the three layers of materials 255 as thin as possible to ensure adequate thermal conductivity between the attached die and the conductive pad 220. Limiting the thickness of the three layers of materials 255 may provide low thermal resistance, thus, allowing more heat to be dissipated through the conductive pad 220. The thermal dissipation aspect may be one consideration in packaging design for the optocoupler 200. The reason for this is that recent advances in technology permits more and more transistors to be packed into the optical transmitter die 250 and the optical receiver die 240, generating more heat per unit area then before.

In the embodiment shown in FIG. 3, the optical transmitter die 250 is attached to the conductive pad 220 through the three layers of materials 255 while the optical receiver die 240 is attached directly to the conductive pad 220. This design may also be reversed. For instance, the optical transmitter die 250 may be attached directly to the conductive pad 220, while the optical receiver die 240 may be attached to the conductive pad 220 though the three layers of insulating attachment materials 255. The choice may be based on various design considerations, such as relative height profiles, thermal conductance requirements, power and ground requirements of each die, and the like.

One possible design consideration is that attaching a die directly to the conductive pad 220 results in lower thermal resistance between the die and the conductive pad 220. The conductive pad 220 usually has lower thermal resistance compared to the three layers of insulating attachment materials 255. For example, polyimide used as isolation layer 256 has a thermal conductivity of 0.52 W/mK, epoxy used in securing layers 257 and 258 has a thermal conductivity of 0.7 W/mK, but copper used in the conductive pad 220 has thermal conductivity of 401 W/mK. From a thermal design perspective, one may elect to attach a die generating more heat directly to the conductive pad 220 to enhance heat dissipation and attach other die generating less heat by means of the three layers of insulating attachment materials 255.

Another potential consideration is the relative size of the dies. Specifically, attaching a larger die directly to the conductive pad 220 may yield more robustness. On the other hand, attaching a large die by means of the three layers of insulating attachment materials 255 may cause some undesirable reliability issues, as there may be limitations with respect to securing a large die with layers 257 and 258 onto the conductive pad 220.

Optocouplers with more than one pair of transmitter die 250 and receiver die 240 are known as multi-channel optocouplers. In the event the optocoupler 200 is a multi-channel optocoupler, than only one of the dies may be attached directly to the conductive pad 220, while all other dies may be attached to the conductive pad 220 by means of the three layers of insulating attachment materials 255. In the event of Multi-channel optocouplers, having some of the dies operate using the same external power supply, than more than one die may be attached directly to the conductive pad 220. An embodiment of a multi-channel optocoupler 201 is shown in FIG. 4, by way of example, in order to illustrate this aspect in more detail.

Figure 4:
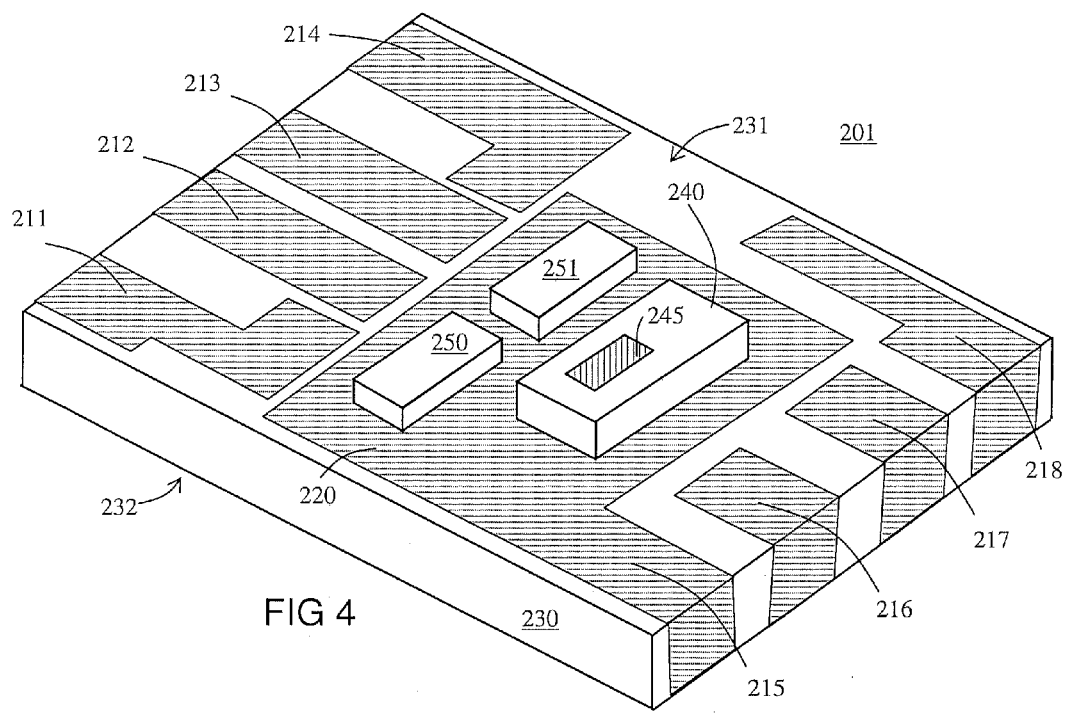
FIG. 4 illustrates an embodiment of a partially completed multi-channel optocoupler having two optical transmitters and one optical receiver, without wire bonds and without an encapsulant.

With reference to FIG. 4, an embodiment of a partially completed multi-channel optocoupler 201 is illustrated. The multi-channel optocoupler of FIG. 4 is shown without wire bonds or an encapsulant and includes a substrate 230, two optical transmitter dies 250-251 and one optical receiver die 240. The substrate 230 has a top surface 231 and a bottom surface 232. A plurality of conductors 211-218 are located on the substrate 230. One of the plurality of conductors 215 may be extended to form a conductive pad 220 on the top surface 231. The optical transmitter dies 250 and 251 and the optical receiver die 240 are attached to the conductive pad 220. Attaching the three dies 240, 250, and 251 to a single conductive pad 220 may yield smaller device and overall packaging size, which may also result in lower manufacturing costs. The optical receiver die 240 comprises a photo detector 245. The plurality of conductors 211-218 may be extended to the edge or the bottom surface 232 of the substrate 230 to serve as electrical contacts to external circuitry (not shown).

Consider a first case in which the two optical transmitter dies 250 and 251 and the optical receiver die 240 are operated under three different power supplies which requires electrical isolation. In this scenario, the optical receiver die 240 may be attached to the conductive pad 220, assuming the optical receiver die 240 is a larger size and generates more heat than the two optical transmitter dies 250 and 251, than this would be a beneficial arrangement for die attachment reliability and heat dissipation purposes. The two optical transmitter dies 250 and 251 may be electrically isolated from the conductive pad 220 and the optical receiver die 240 by attaching the optical transmitter dies 250 and 251 by means of the three layers of insulating attachment materials 255, as discussed with respect to FIG. 3 above.

In a different arrangement, the optical transmitter die 250 and the optical receiver die 240 are operated using a first power supply (not shown) whereas the optical transmitter die 251 is configured to receive power from a second power supply (not shown). As one of ordinary skill in the art will appreciate, the first and second power supplies should be electrically isolated. In this scenario, the optical receiver die 240 and the optical transmitter die 250 may be attached directly to the conductive pad 220. However, the optical transmitter die 251 may be attached to the conductive pad 220 by means of the three layers of insulating attachment materials 255, as discussed with respect to FIG. 3 above.

Figure 5:
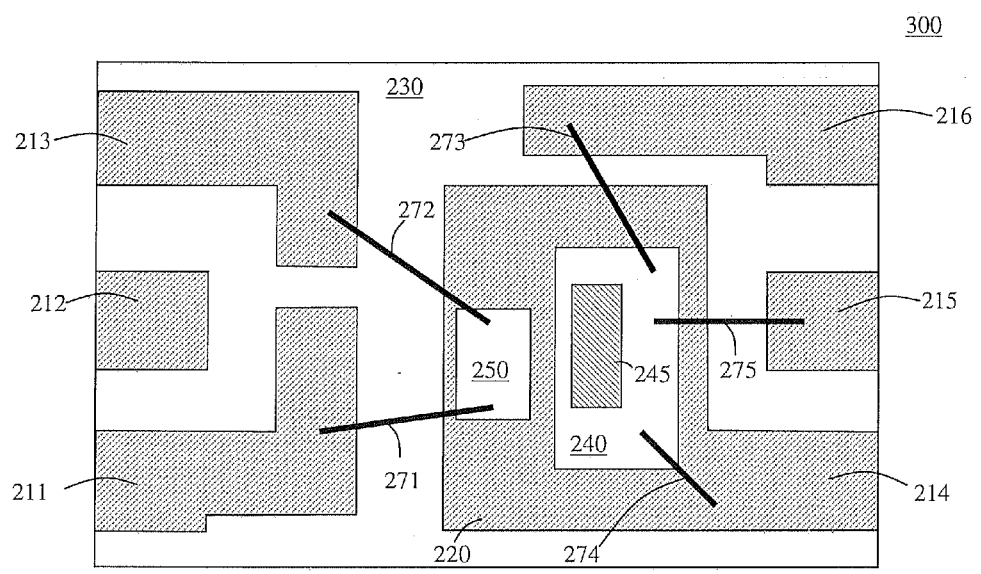
FIG. 5 illustrates an embodiment of a possible bonding diagram for the optocoupler of FIG. 1.

FIG. 5 illustrates an embodiment of a possible bonding diagram 300 for the optocoupler 200 shown in FIG. 1. In this embodiment, the optical transmitter die 250 may be connected to a first external electric circuit (not shown) powered by a first power supply (not shown). The optical receiver die 240 may be connected to a second external electric circuit (not shown) powered by a second power supply (not shown). The conductors 211-216 may comprise a lead frame structure mounted on the substrate 230.

The optical transmitter die 250 may be a light emitting diode (LED), with two terminals for electrical connections. Electric current may be drawn from a first external power source (not shown) through conductor 211 and bond wire 271 into the optical transmitter die 250. The electric current then returns to the first external power source though bond wire 272 and conductor 213 on the substrate 230. The conductor 213 may be connected to the ground node of the first power source. The first power source may be a power supply of a first external circuit (not shown) controlling the optical transmitter die 250. For example, the optical transmitter die 250 may be configured to produce light in accordance to an output signal of the first external circuit.

The optical receiver die 240 may be an integrated circuit (IC) with integrated photo detector 245 and internal amplifier circuits (not shown). The optical receiver die 240 may draw current from a second external power source (not shown) through conductor 216 and bond wire 273. Electric current may then return to the second power source through bond wire 274 and conductor 214. The conductor 214 and the conductive pad 220 may be connected to the ground node of the second power supply. Upon receiving light emitted from the optical transmitter die 250, the optical receiver die 240 may output the received signal to a second external electric circuit (not shown) through bond wire 275 and conductor 215.

Figure 6:
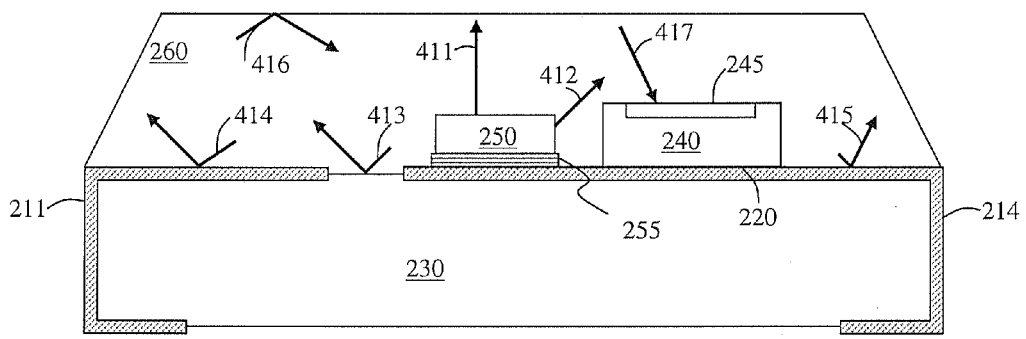
FIG. 6 shows an embodiment of a cross sectional view of the optocoupler along section line 3-3 of FIG. 2 illustrating how light is being transmitted within the clear encapsulant.

FIG. 6 shows a cross-sectional view 400 of the optocoupler along section line 3-3 of FIG. 2, illustrating light being transmitted from optical transmitter die 250 within the clear encapsulant 260. In this embodiment, the encapsulant 260 may be a clear epoxy. The optical transmitter die 250 may be attached to the conductive pad 220 through three layers of materials 255. Light may be emitted from the top surface of optical transmitter die 250, as illustrated by ray 411 or from a side edge of the optical transmitter die 250, as illustrated by ray 412. The substrate 230 of the optocoupler 400 may be made from a highly reflective material such as a poly parabanic acid resin (commonly referred to as PPA), a Liquid crystal polymer (commonly referred to as LCP), or other similar material, such that a substantial amount of light falling onto the top surface of substrate 230 may be reflected back into the encapsulant 260, as illustrated by ray 413 in FIG. 6.

Typically, the conductors 211 and 214 and the conductive pad 220 may be made from a metal, a metal alloy, a metal compound or the like. Therefore, due to the metallic content, the conductors 211 and 214 and the conductive pad 220 may be highly reflective on the surface, reflecting more than 95% of light, as illustrated by rays 414 and 415. Likewise, ray 416 illustrates how light may be reflected back into the encapsulant 260 by means of total internal reflection. Optionally, the encapsulant 260 may also be further coated with a reflective material on the outer surface in order to reflect light back into the encapsulant and further reduce light loss at the top surface of the encapsulant 260. The internal light emitted by LED 250 and falling onto the photo detector 245 of the optical receiver die 240, as illustrated by ray 417, may be converted into an electric signal by the photo detector 245, as is known in the field of optocouplers.

Figure 7:
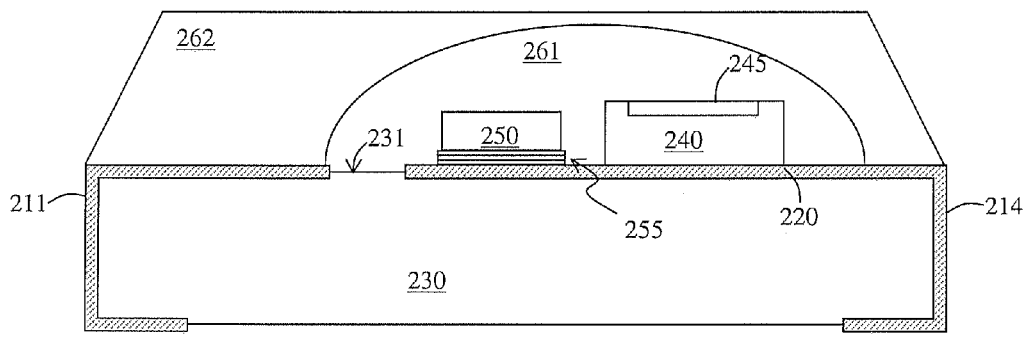
FIG. 7 is a cross sectional view illustrating an embodiment of a double encapsulant optocoupler.

In FIG. 6, light may be transmitted within the entire encapsulant 260. To further reduce the distance that light emitted by optical transmitter die 250 must travel before being absorbed by the photo detector 245, a double encapsulant design may be employed. Such an embodiment is shown in FIG. 7, in which optocoupler 500 utilizes a double encapsulant design. In this embodiment, the optical transmitter die 250 may be attached to the conductive pad 220 through three layers of materials 255. Whereas the optical receiver die 240 may be attached directly to the substrate 230. The first encapsulant 261 may be a clear epoxy and the second encapsulant 262 may be a white epoxy or other opaque material.

The first encapsulant 261 may function as a light guide. Regarding the encapsulant design, having a smaller light guide adequately covering just the optical component ensures minimal light losses within the optocoupler 500. For example, the first encapsulant 261 may be designed to encapsulate as small a portion as possible, but at least covering the light emitting portion of the optical transmitter die 250 and the photo detector 245 of the optical receiver die 240. If the transmitter die 250 is an LED, the first encapsulant 261 may cover at least the optical transmitter die 250 and the photo detector 245 portion of the optical receiver die 240 entirely.

There may be other performance considerations regarding the encapsulant design. Specifically, having a single encapsulant encapsulating the entire optocoupler device elements may yield superior robustness in terms of reliability. For example, in the double encapsulant example shown in FIG. 7, the first encapsulant 261 encapsulates the optical transmitter die 250 and the optical receiver die 240, along with a portion of the top surface 231 of the substrate 230 and a portion of the conductive pad 220. This eliminates the possibility of one die interacting optically with two encapsulants of two neighboring optocoupler devices, which may be a better approach from reliability point of view.

The second encapsulant 262 may be designed to encapsulate all components on the substrate 230, including the components which are not encapsulated by the first encapsulant 261. In the example shown in FIG. 7, the second encapsulant 262 encapsulates the first encapsulant 261, the conductors 211 and 214 along the top surface of the substrate and the top surface 231 of the substrate 230. In the embodiment shown in FIG. 7, the entire top surface 231 of the substrate 230 may be encapsulated by the second encapsulant 262. At the edge and bottom of the substrate 230, the two conductors 211 and 214 may not be encapsulated in order to serve as electrical contacts with external circuitry (not shown).

The double encapsulant design shown in the embodiment of FIG. 7 may be accomplished utilizing a double molding process. After die attach and the wire bond processes, an assembly containing the substrate 230, the optical transmitter die 250 and optical receiver die 240 may be molded or cast with a first mold material, typically a clear epoxy, silicon, or similar material to form the first encapsulant 261. Following completion of the first molding process, the assembly may then be molded or cast with a second opaque mold material, such as plastic, white epoxy, or similar material to form the second encapsulant 262.

The optical transmitter die 250, for example, an LED die may usually be made thinner, for example in the order of 10 mils. However, the optical receiver die 240, for example, a photodiode with integrated circuits may be manufactured in the order of 25 mil thickness. When both the dies 240 and 250 are attached to the same conductive pad 220, light emitted from the optical transmitter die 250 may not be received directly by the optical receiver die 240, but rather only through reflection using the light guide portion or the first encapsulant 261. In order to increase efficiency, one solution is to increase the possibility of light falling directly on to the photo detector 245, by elevating the optical transmitter die 250, for example, by placing the optical transmitter die 250 at a position higher above the substrate 230 in relation to the top surface of the optical transmitter die 250, as shown in FIG. 8.

Figure 8:
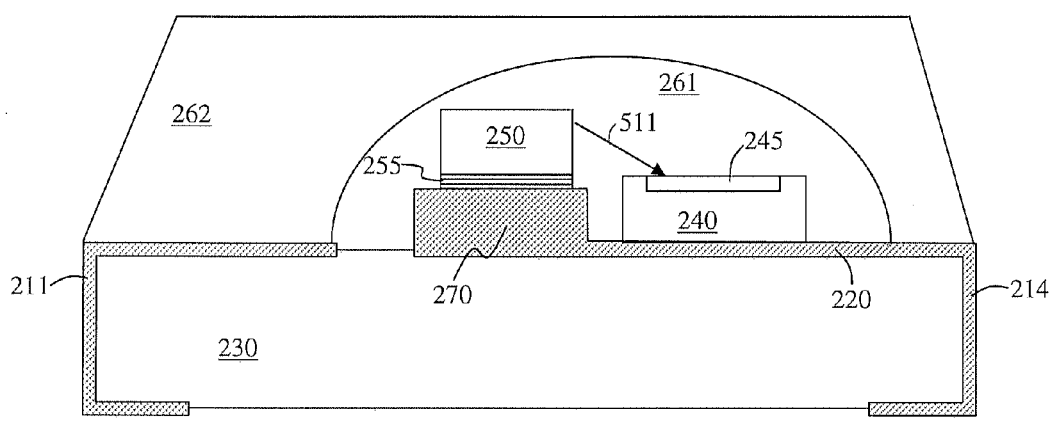
FIG. 8 is a cross sectional view illustrating an embodiment of an optocoupler with elevated optical transmitter die design.

With reference to FIG. 8, a cross-sectional view of an optocoupler 600 with an elevated optical transmitter die is illustrated. A portion of light emitted from the edge of the optical transmitter die 250 as shown by ray 511 may be received directly by the optical receiver die 240 without being reflected off another surface or element. A portion 270 of the conductive pad 220 may be made thicker, such that the optical transmitter die 250, when attached to the elevated portion 270, is elevated relative to the optical receiver die 240. For example, if the optocoupler 600 uses a lead frame, a portion of the lead frame at the area of the conductive pad 220 where the optical transmitter die 250 is attached is made thicker, resulting in the transmitter die 250 being higher than the receiver die.

Alternatively, the substrate 230 may be made thicker at a location where the optical transmitter die 250 is to be attached. The three layers of materials 255 elevate the optical transmitter die 250 to a limited extent. However, this elevation is typically not sufficient, as the three layers of materials 255 may be about 3 mil, whereas the required elevation to elevate the transmitter die 250 above the receiver die may be in the order of 12-25 mils.

The encapsulants may be similar to the designs shown in FIG. 7 with first and second encapsulants 261 and 262. For example, the first encapsulant 261 encapsulates the elevated portion 270, the optical transmitter die 250, the optical receiver die 240, a portion of substrate 230 and a portion of the conductive pad 220. The first encapsulant 261 may function as light guide. The second encapsulant 262 may be added to encapsulate the top surface of the entire substrate 230, while leaving the conductors 211 and 214 at the edge and bottom uncovered in order to permit electrical connections with external circuitry (not shown). In another alternative, the lead frame or substrate may be etched or cut away to form a trough where the optical receiver die 240 is to be attached, thus accomplishing the height differential with the optical transmitter die 250 being higher than the optical receiver die 240.

Figure 9:
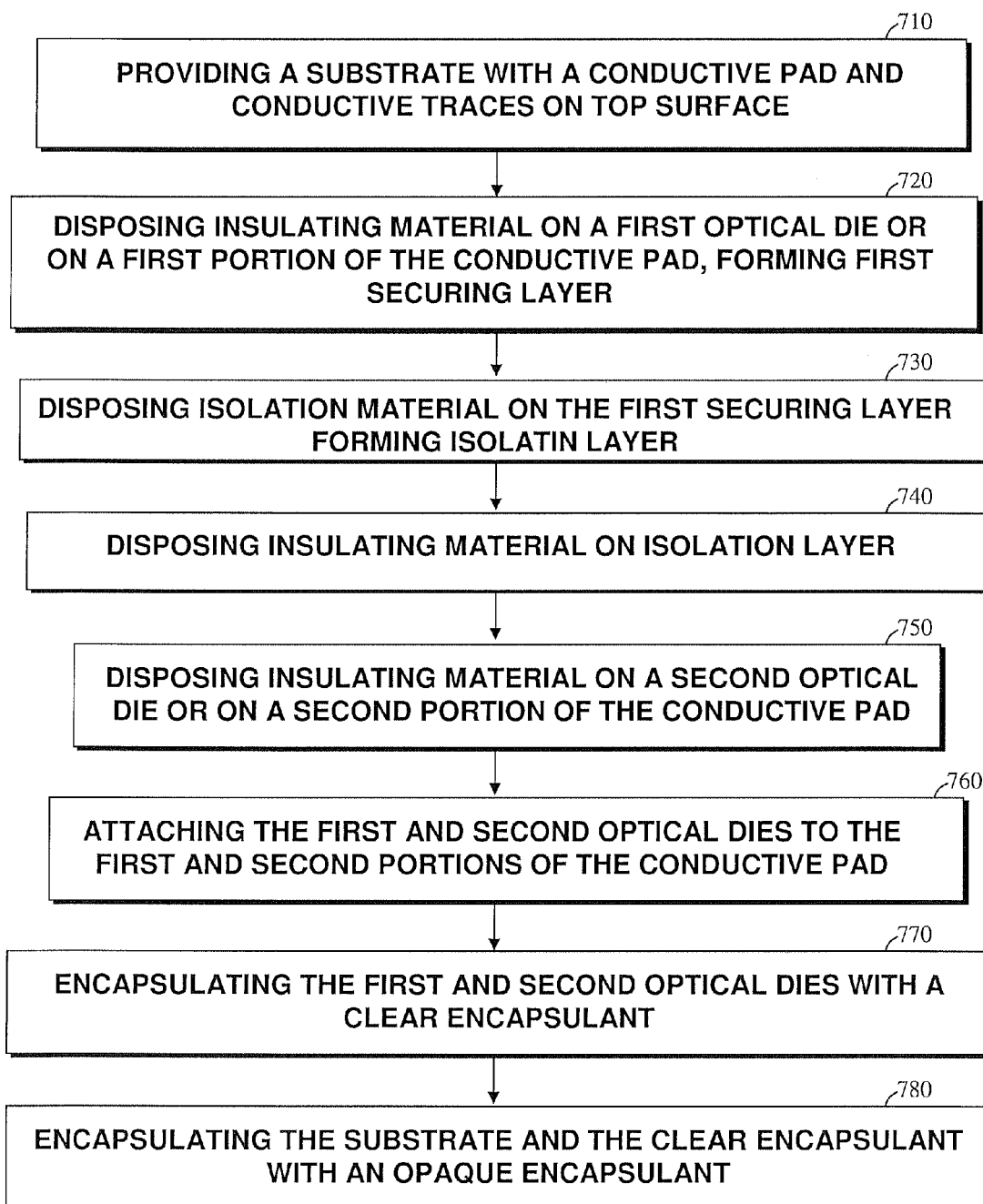
FIG. 9 shows a flow chart illustrating a method for manufacturing an optocoupler.

FIG. 9 is a flow chart 700 illustrating a possible manufacturing process of the optocoupler 500 described in FIG. 7. In step 710, a substrate, such as 230 with a conductive pad 220 and a plurality of electrically conductive traces 211 and 214 are provided. For example, the substrate may be a printed circuit board (PCB) with conductive traces or a lead frame. In step 720, an insulating material is disposed to a portion of a first optical die or a first portion of the conductive pad. The insulating material forms a first securing layer. The first optical die may be an optical transmitter die 250 or an optical receiver die 240. For example, an insulating material may be deposited or formed on a bottom portion of a light emitting diode (LED) die. Alternatively, the insulating material may be deposited or formed on a first portion of the conductive pad where the first die is going to be attached.

The method 700 then proceeds to step 730, in which an isolation material may be deposited or formed on the securing layer of the first optical die or the first portion of the conductive pad. For example, after a securing layer is formed on the bottom side of the LED, an isolation material is further deposited or formed on the bottom of the LED. If the securing layer is formed on the first portion of the conductive pad, the isolation material may be deposited or formed on the securing layer on the conductive pad. The isolation material may be a thin glass, a thin adhesive tape made using polyimide, or like material.

The method 700 next proceed to step 740, in which a clear encapsulant may be formed on the isolation layer mentioned in step 730. After step 740, the three layers of materials 255 comprising an isolation layer sandwiched between two securing layers will have been formed. Method 700 next proceeds to step 750, in which insulating material may be disposed on a second optical die or on a second portion of the conductive pad where the second die may be attached. If the first die is an optical transmitter die, then the second die is an optical receiver die. Similarly, if the first die is an optical receiver die, then the second die is an optical transmitter die.

Method 700 next proceeds to step 760, in which the first and second optical dies are attached to the first and second attachment portions of the conductive pad 220 respectively. Following step 760, one of the optical transmitter dies 250 and receiver dies 240 is attached directly to the conductive pad 220 whereas the other one of the optical transmitter dies 250 and receiver dies 240 is attached to the conductive pad 220 through three layers of materials 255 comprising an isolation layer 256 sandwiched between two securing layers 257 and 258.

The method 700 next proceeds to step 770, in which the first and second optical dies or at least a portion of the first and second optical dies may be encapsulated with a clear epoxy. If only a portion of the first and second optical dies are encapsulated, then at least the light emitting portions of the optical transmitter die 250 and the photo detector portion 245 of the optical receiver die 240 may be encapsulated.

The method 700 next proceeds to step 780, in which the top surface of the substrate is encapsulated with an opaque epoxy such as plastic, white epoxy, or similar material. For example, if the substrate is a PCB, the top surface of the substrate is encapsulated, while leaving a portion of the conductive traces at the edge or bottom of the substrate uncovered in order to form electrical contacts with external circuitry (not shown).

Similar manufacturing steps may be employed to manufacture the optocouplers of FIG. 3 and FIG. 8 with slight modifications. For example, in order to manufacture the device of FIG. 3, all of the steps of the method 700 may be followed until step 770. At that point, a single clear encapsulant may be deposited or formed across the entire top surface of the substrate 230, while leaving the conductors 211 and 214 uncovered at the edges or bottom in order to facilitate electrical connections with external circuitry (not shown). Further, with respect to the method for manufacturing the device of FIG. 8, the initial step 710 may be to provide a substrate 230 having conductive traces and a conductive pad 220 with a raised portion 270 where the optical transmitter die 250 is to be attached. The remainder of the steps of the method 700 would then proceed as for the manufacturing of the device of FIG. 8.

Although specific embodiments of the invention have been described and illustrated, the invention is not to be limited to the specific forms or arrangements of parts so described and illustrated. It is to be understood that the illustration and description shall not be interpreted narrowly. For example, the optical transmitter die 250 may be an LED, but may also be a die with an integrated LED and circuitry or a light source using future technologies. The scope of the invention is to be defined by the claims appended hereto and their equivalents.

What is claimed is:

1. An optocoupler comprising:
   a substrate;
   a plurality of conductive traces on the substrate;
   a conductive pad located on the substrate;
   an optical transmitter die, the optical transmitter die operable to emit light;
   a first conductive trace of the plurality of conductive traces configured to provide power to the optical transmitter die from a first power supply;
   an optical receiver die, the optical receiver die operable to receive light generated by the optical transmitter die; and
   a second conductive trace of the plurality of conductive traces configured to provide power to the optical receiver die from a second power supply, the first conductive trace being electrically isolated from the second conductive trace;
   wherein one of the optical transmitter and receiver dies is attached directly to the conductive pad, the other one of the optical transmitter and receiver dies is attached to the conductive pad through three layers of materials comprising an isolation layer sandwiched between two attachment layers.

2. The optocoupler of claim 1, further comprising a clear encapsulant that encapsulates the substrate, the conductive pad, the plurality of conductors, the optical transmitter and receiver dies, wherein the clear encapsulant is configured to transfer light from the optical transmitter die to the optical receiver die.

3. The optocoupler of claim 2, wherein the clear encapsulant is coated with a reflective material such that the clear encapsulant functions as a light guide channeling light from the optical transmitter die to the optical receiver die.

4. The optocoupler of claim 1, further comprising:
   a clear encapsulant encapsulating at least a portion of the optical transmitter and receiver dies, the clear encapsulant configured to direct light from the optical transmitter die to the optical receiver die; and
   an opaque encapsulant encapsulating the clear encapsulant and the substrate.

5. The optocoupler of claim 4, wherein the clear encapsulant has a shape configured to focus light emitted from the optical transmitter die to the optical receiver die.

6. The optocoupler of claim 4, wherein the clear encapsulant is formed using a first molding process and the opaque encapsulant is formed using a second molding process.

7. The optocoupler of claim 1, wherein the optical transmitter die comprises a light emitting diode and the optical receiver die comprises a photo detector.

8. The optocoupler of claim 7, wherein the optical receiver die comprises an amplifier circuit operable to amplify photocurrent induced by light received at the photo detector of the optical receiver die.

9. The optocoupler of claim 1, wherein the three layers of materials are configured to provide electrical isolation, while permitting thermal conductivity between the one of the optical transmitter and receiver dies, and the conductive pad.

10. The optocoupler of claim 1, further comprising at least a second optical transmitter die, wherein the second optical transmitter die is attached to the conductive pad through three layers of materials comprising an isolation layer sandwiched between two attachment layers.

11. The optocoupler of claim 1, further comprising at least a second optical receiver die, the second optical receiver die is attached to the conductive pad through three layers of materials comprising an isolation layer sandwiched between two attachment layers.

12. The optocoupler of claim 1, wherein the conductive pad further comprises an elevated portion, the optical transmitter die is attached to the elevated portion of the conductive pad such that a portion of light emitted from the optical transmitter die is configured to be received directly by the optical receiver die.

13. An optocoupler comprising:
   a substrate;
   a plurality of conductive traces located on the substrate;
   an optical transmitter die, the optical transmitter die operable to emit light, the optical transmitter die configured to be powered from a first power supply through one of the plurality of conductive traces;
   an optical receiver die, the optical receiver die operable to receive light emitted by the optical transmitter die, the optical receiver die configured to be powered from a second power supply through one of the plurality of conductive traces; and
   a conductive pad located on the substrate, wherein one of the optical transmitter and receiver dies is attached directly to the conductive pad, the other one of the optical transmitter and receiver dies is attached to the conductive pad through three layers of materials comprising an isolation layer sandwiched between two securing layers.

14. The optocoupler of claim 13, further comprising:
   a clear encapsulant encapsulating at least a portion of the optical transmitter and receiver dies, the clear encapsulant configured to convey light from the optical transmitter die to the optical receiver die; and
   an opaque encapsulant encapsulating the clear encapsulant and the substrate.

15. The optocoupler of claim 14, wherein the clear encapsulant has a shape configured to focus light emitted from the optical transmitter die to the optical receiver die.

16. The optocoupler of claim 13, wherein the optical transmitter die further comprises a light emitting diode and the optical receiver die further comprises a photo detector.

17. The optocoupler of claim 13, further comprising at least a second optical transmitter or receiver die, the second optical transmitter or receiver die attached to the conductive pad through three layers of materials comprising an isolation layer sandwiched between two securing layers.

18. The optocoupler of claim 13, wherein the conductive pad further comprising an elevated portion, the optical transmitter die attached to the elevated portion of the conductive pad and the optical receiver die attached to the conductive pad outside of the elevated portion such that a portion of light emitted from the optical transmitter die operable to be received directly by the optical receiver die.

19. The optocoupler of claim 13, wherein the three layers of materials configured to provide electrical isolation, while permitting thermal conductivity between the one of the optical transmitter and receiver dies and the conductive pad.

20. An optocoupler comprising:
a conductive pad;
an optical transmitter die configured to emit light;
an optical receiver die configured to receive light; and
an encapsulant encapsulating the optical transmitter and receiver dies;
wherein both the optical transmitter and receiver dies are attached to the conductive pad such that one of the optical transmitter and receiver dies is attached directly to the conductive pad, and the other one of the optical transmitter and receiver dies is attached to the conductive pad through three layers of materials comprising an isolation layer sandwiched between two securing layers; and
wherein the conductive pad comprises an elevated portion configured to receive the optical transmitter die such that a portion of light emitted from the optical transmitter die is configured to be received directly by the optical receiver die located on the conductive pad outside the elevated portion.

* * * * *